United States Patent
Vinson et al.

(10) Patent No.: US 6,435,889 B1
(45) Date of Patent: Aug. 20, 2002

(54) REDUCED COMPLEXITY HOT PLUG BLIND MATE FAN ASSEMBLY AND CONNECTOR THEREFOR

(75) Inventors: Wade D. Vinson, Magnolia; Joseph R. Allen, Tomball; Thomas Hardt, Missouri City, all of TX (US)

(73) Assignee: Compaq Information Technologies Group, L.P., Houston, TX (US)

( * ) Notice: Subject to any disclaimer, the term of this patent is extended or adjusted under 35 U.S.C. 154(b) by 0 days.

(21) Appl. No.: 09/752,129

(22) Filed: Dec. 29, 2000

(51) Int. Cl.[7] .............................................. H01R 13/64
(52) U.S. Cl. ........................ 439/247; 439/248; 361/695
(58) Field of Search ................................ 439/247, 248, 439/387, 527, 532, 954, 358, 923; 361/695, 697, 688, 690; 454/184

(56) References Cited

U.S. PATENT DOCUMENTS

| | | | |
|---|---|---|---|
| 2,891,103 A | * 6/1959 | Swengel ..................... 174/153 |
| 5,754,406 A | 5/1998 | Hardt et al. ................ 361/756 |
| 5,822,196 A | 10/1998 | Hastings et al. ........... 361/801 |
| 6,058,011 A | 5/2000 | Hardt et al. ................ 361/694 |
| 6,062,872 A | 5/2000 | Strange et al. ............... 439/67 |
| 6,074,296 A | * 6/2000 | Wu ............................ 454/18 |
| 6,101,459 A | 8/2000 | Tavallaei et al. ........... 702/132 |
| 6,190,197 B1 | * 2/2001 | Polgar et al. ............... 439/527 |

* cited by examiner

Primary Examiner—Tho D. Ta
Assistant Examiner—Phuongchi Nguyen
(74) Attorney, Agent, or Firm—Conley, Rose & Tayon, P.C.

(57) ABSTRACT

A fan assembly that can be easily inserted into a mating slot includes: a housing surrounding and supporting a fan, a least one grill positioned so as to restrict access to the fan, a grip surface on the housing, a latch on the housing and configured to engage the mating slot; and, and an electrical connector mounted in the housing. The grip surface is formed on a separate piece from the housing and is affixed to the housing by an integrally formed fastening device and the assembly including the housing, grill, grip surface, latch and connector can be assembled by hand without the use of separate fasteners.

19 Claims, 5 Drawing Sheets

REDUCED COMPLEXITY HOT PLUG BLIND MATE FAN ASSEMBLY AND CONNECTOR THEREFOR

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

1. Field of the Invention

The present invention relates generally to a hot plug fan for use in a computer. More particularly, the present invention relates to a fan housing that includes a floating connector and can be rapidly assembled without the use of tools. Still more particularly, the present invention relates to a fan assembly that includes snap-together parts that form a housing that can releasably engage a slot in a computer housing.

2. Background of the Invention

Fans or other air moving devices for a file server or other computer are often mounted in a vertical fan support housing. For operational convenience and flexibility, each fan is typically "hot plug" connected within the support housing. As used herein the term "hot plug" or "hot-pluggable" refers to any type of electrical connection that permits the equipment in question to be removed and re-installed or replaced without disturbing the operation of other components.

In conventional practice, each fan is mounted inside a fan cage, and includes a connector tethered on a cable. The connector is insertable into a back plane hot plug socket within the fan support housing. The fan cage must be assembled around the fan and connector and cable using several fasteners and the fan cage itself must then be inserted with precision, so that the tethered connector is properly aligned and connected. Some or all of the following problems, limitations and disadvantages are commonly associated with conventional hot plug fan assembles Is of this general type:

1. The assembly steps are time consuming and therefore costly and it is desirable to provide a fan assembly that can perform at least as well as conventional fan assemblies without requiring as much assembly time.
2. In addition to requiring several assembly steps, the conventional fan cage requires a significant volume of space, which is then unavailable for use as part of the fan operating volume. As the cooling capability of the fan is a function of its size, it is desirable to reduce the mount of space required by the fan cage.
3. Furthermore, the tethered connector that is used to make the hot plug must be manipulated into position in order to make the electrical connection. This make it necessary to achieve relatively tight tolerances in the manufacturing of the components so as to avoid mis-installing or damaging the connector. Tight tolerances, in turn, increase manufacturing costs. Hence, it is desired to provide a hot plug fan that can engage the corresponding hot plug socket without requiring tight tolerances.
4. The use of a separate assembly for holding the tethered connector and fan tends to increase both the complexity and cost associated with removably supporting each fan, and typically presents wire ends, which the installer must carefully handle to avoid cable damage when in stalling and removing the fan from the cage. Hence, it is desired to provide a caged fan that does not require a separate connector assembly in its cage.
5. On some caged fans, a considerable amount of manual pulling force is required to disconnect the board from its associated hot plug socket within the cage. Other conventional fans must be screwed or pinned to the support socket, thereby increasing the overall complexity and fabrication cost of the support system. Hence, it is desired to provide a fan that can be removed and replaced under hot plug conditions without undue force or the use of tools.

It can be seen from the foregoing that it would be desirable to provide a hot plug fan assembly with a variety of operational, assembly, and safety improvements. It is accordingly an object of the present invention to provide hot plug-connected fan assembly incorporating such improvements.

BRIEF SUMMARY OF THE INVENTION

The present invention provides a fan assembly having many desirable features. Specifically, the present invention provides a fan assembly that can perform at least as well as conventional fan assemblies and requires much less assembly time. The present fan assembly also reduces the amount of space required by the fan cage, thereby allowing a larger fan to be fit into a given slot size. In a preferred embodiment, the present fan assembly provides a hot plug fan that includes a floating connector that can engage the corresponding hot plug socket without requiring tight tolerances. The present fan assembly does not require a circuit board in its cage, and can be removed and replaced under hot plug conditions without undue force or the use of tools. For all of these reasons, the present fan assembly provides a variety of operational, assembly, and safety improvements.

According to one preferred embodiment, the present invention comprises a fan housed in a fan housing, and a fan grill, grip plate, and latch plate, all of which can be assembled to form the fan assembly in a few seconds without the use of tools.

More particularly, one embodiment comprises a fan assembly that can be easily inserted into a mating slot. The assembly includes: a housing surrounding and supporting a fan, at least one grill positioned so as to restrict access to the fan blades, a grip surface on the housing, a latch on the housing configured to engage the mating slot, and a electrical connector mounted in the housing. The grip surface is formed on a separate piece from the housing and is affixed to the housing by an integrally formed fastening device and the assembly comprising the housing, grill, grip surface, latch and connector can be assembled by hand without the use of separate fasteners.

In further embodiments, the latch is included on a latch piece that is separate from the housing, and may be affixed to the housing by an integrally formed fastening device, the connector is included on a connector piece that is separate from the housing and may be affixed to the housing by an integrally formed fastening device, and/or the grill is included on a grill piece that is separate from the housing and may be affixed to the housing by an integrally formed fastening device.

In still further embodiments, the fan assembly includes a grip piece and the grill piece is maintained in alignment with the housing by the grip piece. Alternatively, or in addition, the fan assembly includes a latch piece, which may maintain the grip piece in engagement with the housing.

It is preferred that the grill, the latch, and the grip are assembled sequentially, with each piece engaging the housing and maintaining the previously assembled pieces in engagement with the housing.

The present fan assembly can also include an electrical connector that includes at least one pin. The electrical connector is mounted on the housing such that the connector can move in directions normal to the pin but is substantially restrained from moving in directions parallel to the pin. In a preferred embodiment, the electrical connector is held in place on the housing by a connector clip that snaps into the housing.

BRIEF DESCRIPTION OF THE DRAWINGS

For a more detailed discussion of the preferred embodiments of the invention, reference will be made to the accompanying Figures, wherein.

NOTATION AND NOMENCLATURE

Certain terms are used throughout the following description and claims to refer to particular system components. As one skilled in the art will appreciate,.computer companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . .". Also, the term "couple" or "couples" is intended to mean either an indirect or direct electrical connection. Thus, if a first device couples to a second device, that connection may be through a direct electrical connection, or through an indirect electrical connection via other devices and connections.

DETAILED DESCRIPTION OF THE PREFERRED EMBODIMENTS

Figure 1:
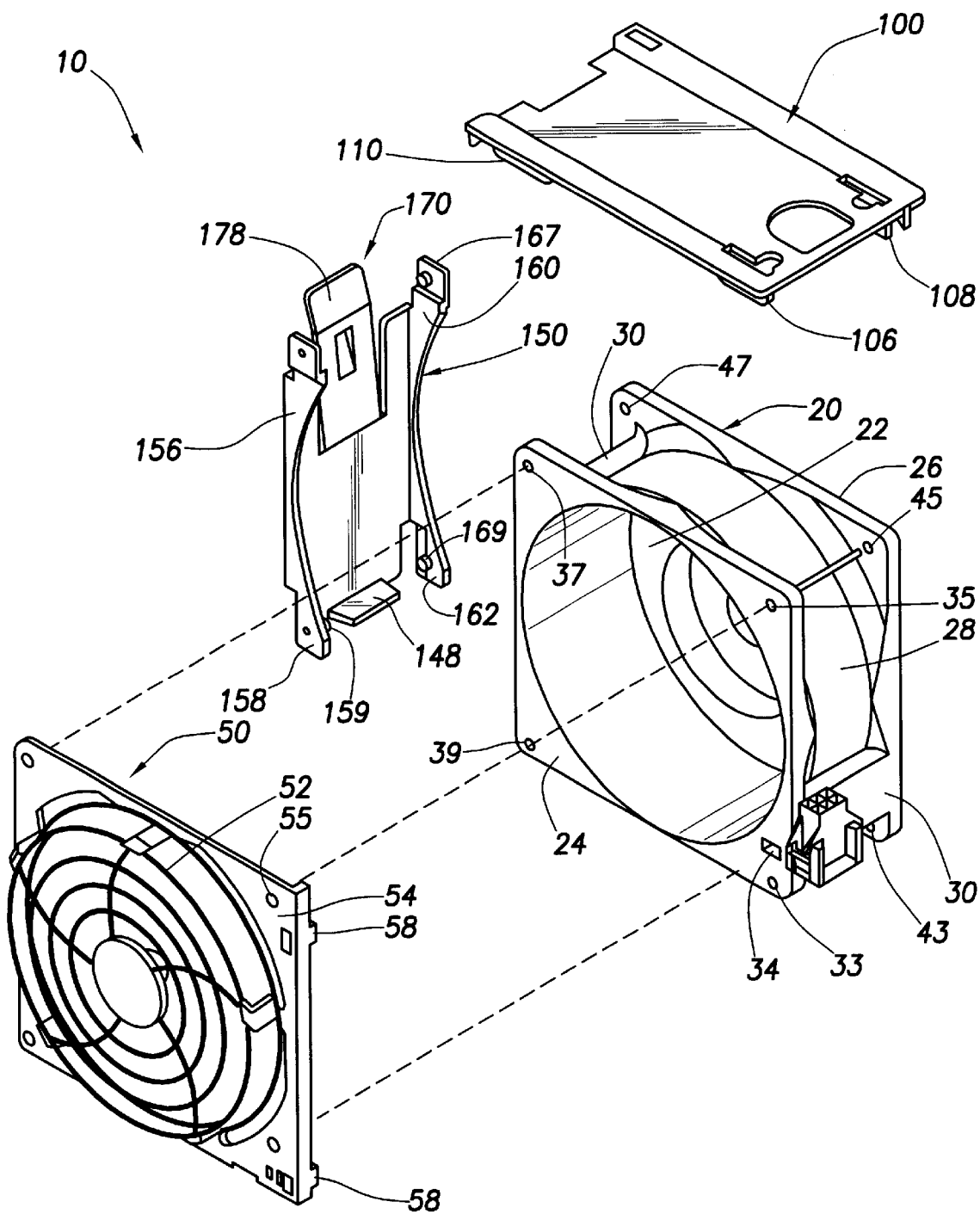
FIG. 1 is an exploded view of one embodiment of the present fan assembly.

Referring initially to FIG. 1, a preferred embodiment of the present fan assembly includes a fan 10 in a fan housing 20, a grill 50, grip plate 100, and latch plate 150.

Fan 10 is a conventional motor-driven fan such as are commonly used to cool computer components. According to a preferred embodiment, fan 10 is factory-mounted within fan housing 20 so as to be rotatable within the housing. Fan housing 20 is typically substantially square shaped, so as to slide into a corresponding slot in the computer. It is preferred that the diameter of the fan be only slightly smaller than the width of fan housing 20, so as to maximize the size of fan 10 within the available space.

According to a preferred embodiment, housing 20 includes a substantially flat front plate 24 and a substantially flat rear plate 26, with a cylindrical fan shroud 28 extending between them. Housing 20 also includes at least one brace 30 extending between front and rear plates 24, 26. In a preferred embodiment, a plurality of braces 30 are provided, with each brace being substantially planar and extending between front and rear plates 24, 26 in the corners defined between the perimeter of fan shroud 28 and the perimeter of front and rear plates 24, 26. Braces 30 serve a variety of purposes, as discussed below, including providing mechanical strength and rigidity to housing 20. Front plate 24 preferably includes one hole 33, 35, 37, 39 in each corner and a slot 34 adjacent to hole 33. Likewise, rear plate 26 preferably includes holes 43, 45, 47, and hole 49 (not shown) in each corner and a slot 44 (not shown) adjacent to hole 43.

It is further preferred that fan housing 20 include at least one fan guard or grill 22 that is formed integrally as part of fan housing 20. It is more preferred that fan housing 20 include two grills, with one on each side of fan 10, but it is believed that it will be more economical to manufacture fan housing 20 with an integral single grill.

Figure 2:
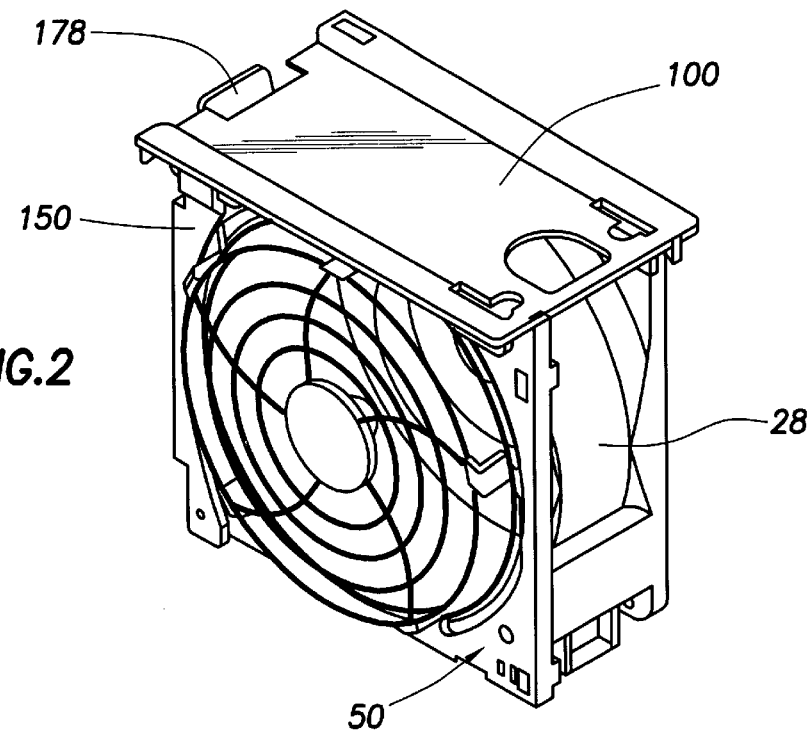
FIG. 2 is a perspective view of the assembled fan housing of FIG. 1.

In view of this fact, a separate, a second, separate grill 50 is provided, as shown in FIGS. 1–2. Grill 50 can be added after assembly of fan 10 in housing 20 is complete. Grill 50 includes a circular guard portion 52, which prevents inadvertent contact with the fan blades, and an integrally formed substantially square plate 54, which defined four corners around guard 52. Grill 50 includes holes 55, 57, and 59 (FIG. 4) in its corners, whose positions correspond to the positions of holes 35, 37, and 39 on front plate 24.

Figure 3:
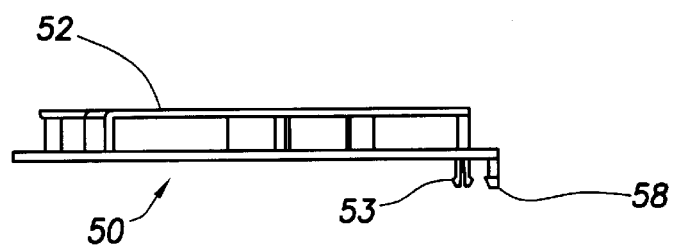
FIGS. 3 and 4 are bottom and perspective views, respectively, of the grill 50 of FIG. 1.
Figure 4:
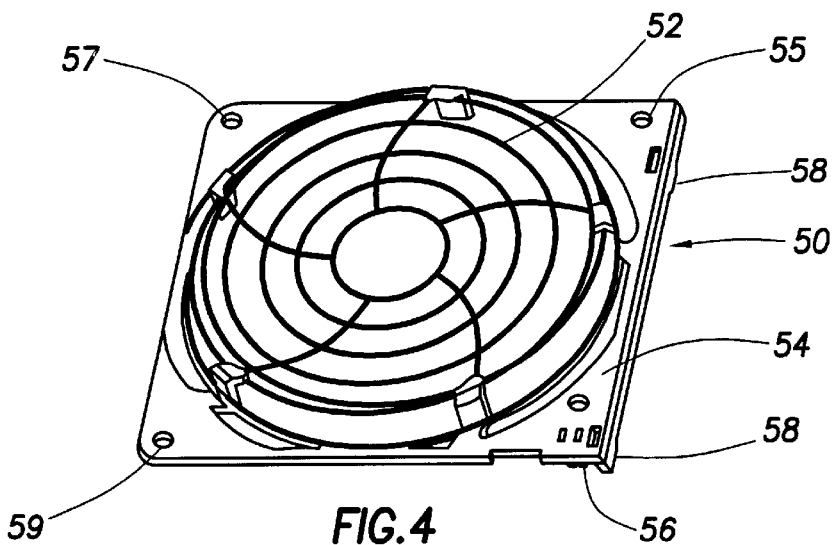

Referring particularly to FIGS. 3 and 4, one corner of plate 54 is preferably provided with a split retaining pin 53 on its inside face. Split retaining pin 53 snaps into and releasably engages hole 33 in one corner of fan housing 20 and provides a means for maintaining grill 50 in a desired position on the face of fan housing 20 without requiring the use of tools to attach grill 50 to fan housing 20. It will be understood that other snap-type mechanisms, including tabs or a snap ring, and other non-snap devices, such as adhesive, can be used to provide an easily engaged, releasable connection between grill 50 and fan housing 20.

If a split retaining pin 53 is used to hold grill 50 in place, it is preferred to provide only a single pin 53, rather than, for example, a pin at each corner. Previous assemblies used up to four or five deformable plastic rivets to secure grill 50 to housing 20. Using a single pin allows the connection between grill 50 and housing 20 to be made quickly, as only one pin needs to be aligned. Even though grill 50 can rotate about pin 53 with respect to fan housing 20, in a preferred embodiment grill 50 is subsequently held in its desired position by other components, as discussed in detail below. In addition, it is preferred to provide one edge of plate 54 with at least one, and preferably two, fingers 58, which snap over the edge of front plate 24 when split retaining pin 53 engages plate 24. Fingers 58 help to align grill 50 with front plate 24.

Figure 5:
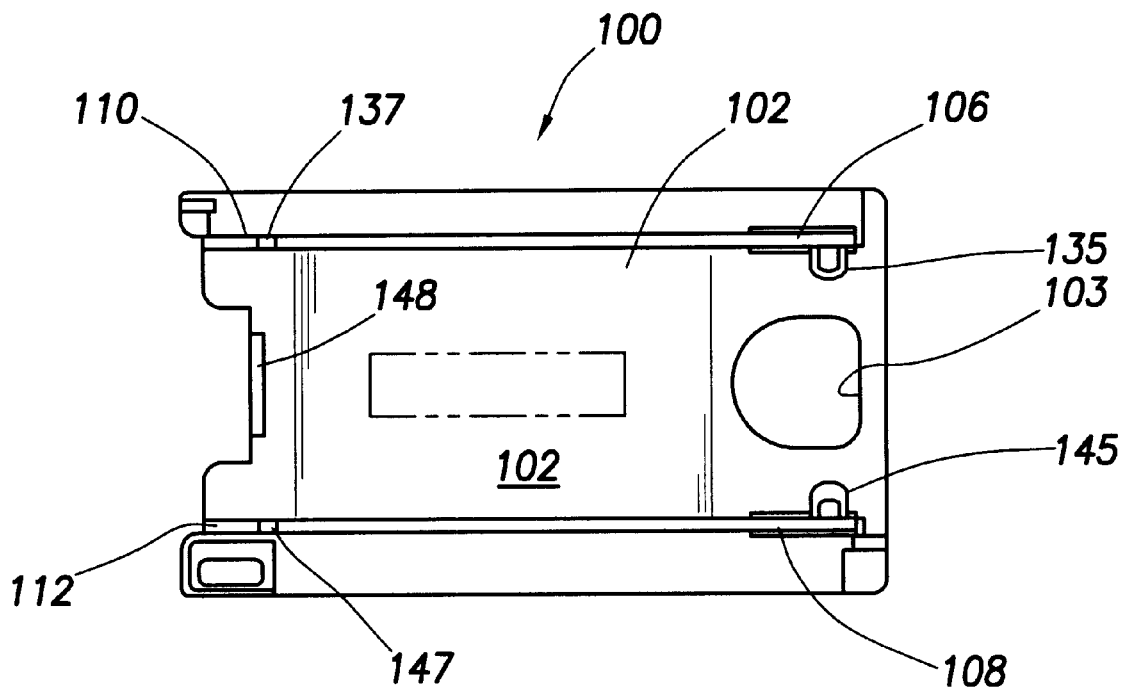
FIGS. 5 and 6 are inner and side views, respectively, of the grip plate of FIG. 1.
Figure 6:
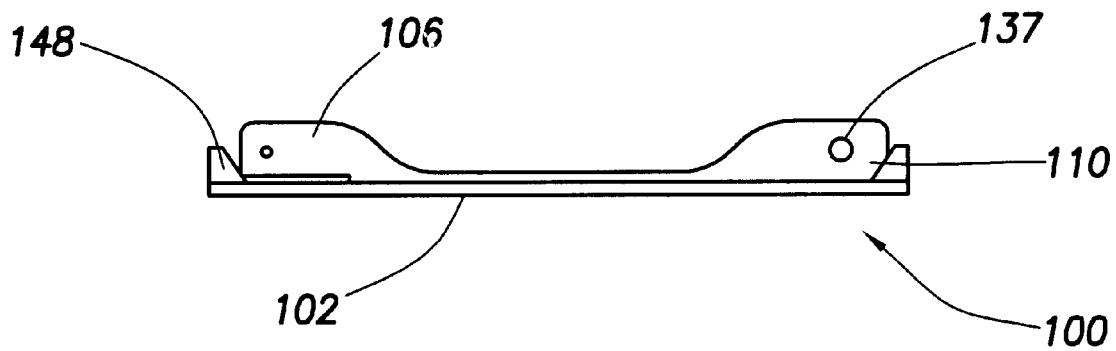

Once fan housing 20 is equipped with two grills, grip plate 100 is installed. As shown in FIGS. 1, 5 and 6, grip plate 100 preferably includes a substantially flat panel 102, with a finger hole 103 near one end and a plurality of perpendicularly extending latching tabs 106, 108, 110, 112. Tabs 106, 108, 110, 112 are preferably perpendicular to the inner surface of panel 102 and parallel to the long axis of panel 102. Latching tabs 106 and 108 are adjacent to finger hole 103 and are approximately as far apart as the distance between the outer surface of grill 50 and the outer surface of rear plate 26. Latching tabs 110 and 112 are at the opposite end of panel 102 and are also approximately as far apart as the distance between the outer surface of grill 50 and the outer surface of rear plate 26. Tabs 110 and 112 each include a hole 137, 147 therethrough. Tabs 106 and 108 each include a boss 135, 145 extending from their inner surfaces toward finger hole 103. Grip plate 100 also preferably includes a stop 148 extending perpendicularly to its inner surface and perpendicularly to its long axis.

When grip plate 100 is added to the fan/grill assembly, boss 135 engages both holes 55 and 35 on grill 50 and front plate 24, respectively. Boss 145 engages hole 45 on rear plate 26. Tabs 110 and 112 bracket the fan/grill assembly. The engagement of bosses 135 and 145 maintains grip plate 100 in its desired position on housing 20. The engagement of boss 135 also prevents grill 50 from rotating with respect to housing 20. Because in a preferred embodiment grill plate 54 overlaps the edge of front plate 24, hole 55 is farther from the overlapping edge of plate 54 than it is from the adjacent edge. Grip panel 102 extends over this edge and thereby prevented from rotating about the axis defined by bosses 135, 145. It will be understood that rotation of grip plate 100 with respect to the fan/grill assembly could be prevented in a variety of ways, such as by using square-sectioned bosses, or by not rounding the corners of either plate 54 or 24, and the preferred construction is not intended to be limiting.

Figure 7:
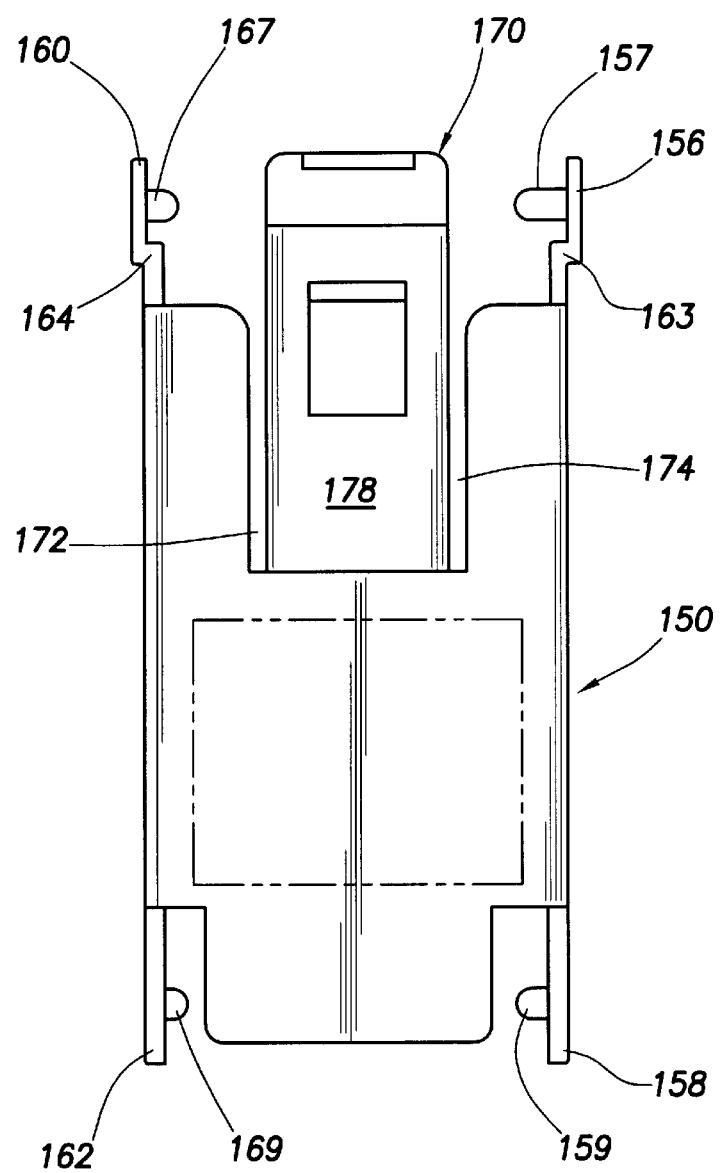
FIGS. 7 and 8 are outer and side views, respectively, of the latch plate of FIG. 1.
Figure 8:
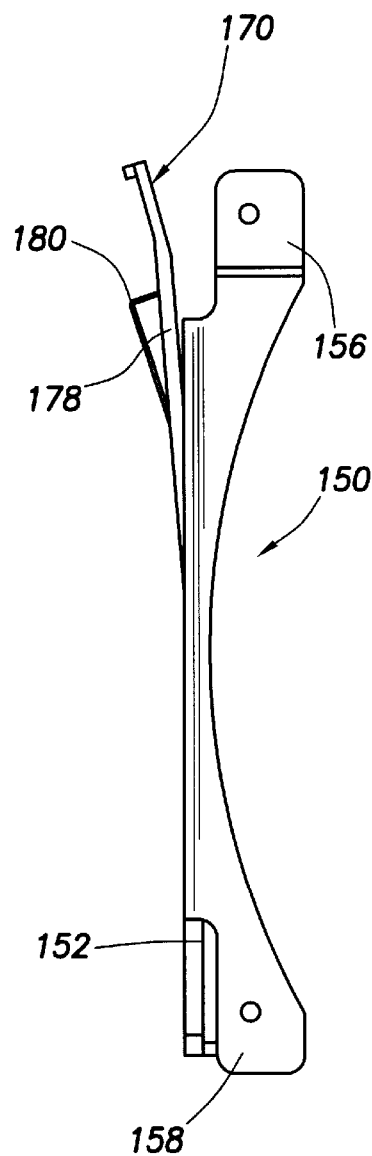

Referring now to FIGS. 1, 7, and 8, latch plate 150 includes a substantially flat panel 152 with tabs 156, 158, 160, and 162 extending perpendicularly from its long edges. Tab 156 includes an outward dogleg 163 and a boss 157 extending perpendicularly from its inner surface. Tab 158 is substantially straight and includes a boss 159 extending perpendicularly from its inner surface. Tab 160 includes an outward dogleg 164 and a boss 167 extending perpendicularly from its inner surface. Tab 162 is substantially straight and includes a boss 169 extending perpendicularly from its inner surface. While the distance between each pair of tabs 156, 160 and 158, 162 substantially equal to the distance between the outer surface of grill 50 and the outer surface of rear plate 26, dog legs 158 and 164 allow the ends of tabs 156, 160 to encompass all of the thicknesses of the assembled components.

Latch plate 150 also includes a central spring-loaded latch member 170. Latch member 170 is preferably formed by providing two parallel slots 172, 174 in from one short edge of panel 152, and bending the resulting tongue 178 slightly outward, so that it does not lie in the, plane of panel 152. Tongue 178 preferably includes a outwardly extending boss 180.

When latch plate 150 is added to the fan/grill/grip assembly, boss 157 engages all three holes 135, 57 and 37, boss 159 engages both holes 59 and 39, boss 167 engages both holes 147 and 47, and boss 169 engages hole 49. Because the various bosses engage differing thicknesses of material, it is preferred that they have correspondingly different lengths. For this reason, it is further preferred that they engage their respective holes in the order recited above.

Once all four bosses on latch plate have engaged their respective holes, the four components of the present fan assembly, namely fan housing 20, grill 50, grip plate 100 and latch plate 150 are substantially rigidly held in place. This configuration allows for adaptability of the parts and provides an assembly that is much faster and simpler to assemble than previously known assemblies. Because of the slight deformations that must occur as the components are snapped into place, it is preferred to construct the components from a substantially rigid but slightly flexible material, such as are known in the art.

Figures 9, 10:
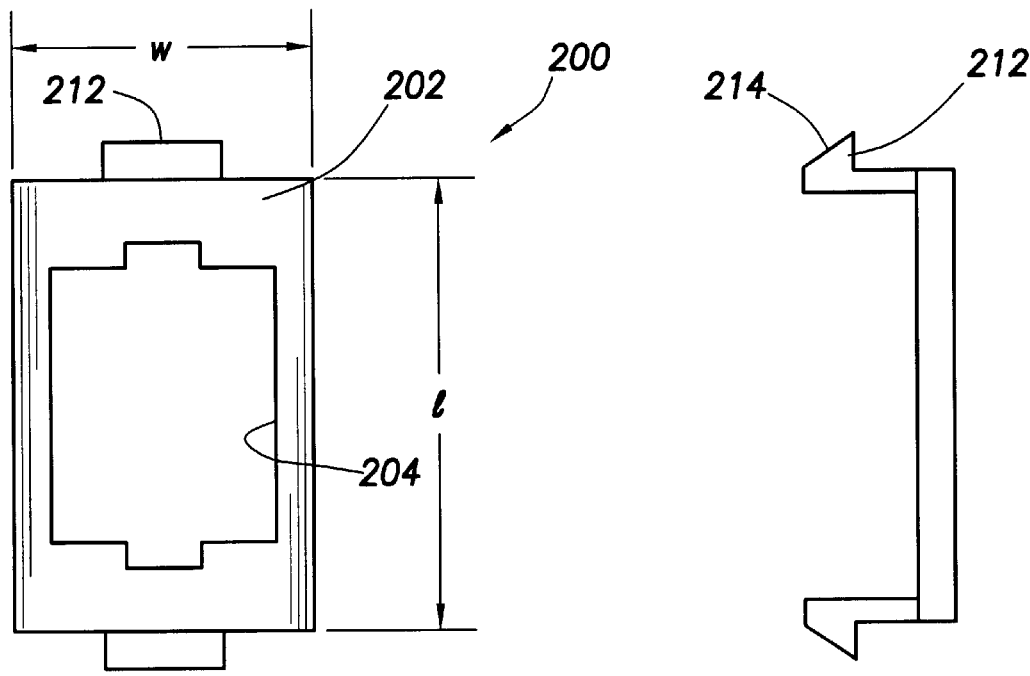
FIG. 9 is an exploded view of the connector of FIG. 1.
FIG. 10 is a side view of the connector of FIG. 9.

Referring now to FIGS. 9 and 10, a preferred connector clip 200 for use with the present assembly includes a substantially flat panel 202 with a substantially rectangular central opening 204 therethrough. Panel 202 is sized such that its width w is less than the length of one side of one corner of front plate 24 where it extends beyond fan shroud 28 and its length l is slightly, less than the distance between the inner surface of front plate 24 and the inner surface of rear plate 26. Each end of panel 202 includes a retaining finger 210 extending perpendicularly therefrom. Each retaining finger preferably includes an outwardly extending lip 212 with a tapered back surface 214. The distance between the outer edges of lips 212 is preferably greater than the distance between front plate 24 and rear plate 26.

Figure 11:
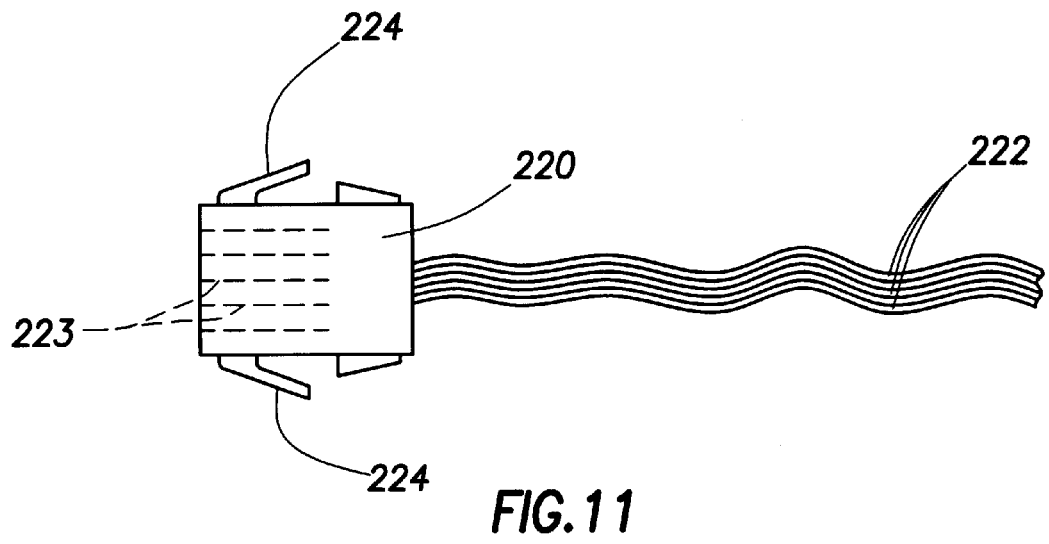
FIG. 11 is a side view of an electrical connector suitable for use in conjunction with the present invention.

Connector clip 200 engages and supports an electrical connector 220 (FIG. 11), which provides multiple electrical connections between wires 222 and a corresponding plurality of sockets using a plurality of pins 223 (shown in phantom). The mating side of connector 220 preferably has a chamfered mouth, so as to facilitate alignment of the electrical connectors. Wires 222 provide power and control signals to fan 10, as is known in the art. The method of engagement between clip 200 and connector 220 can be any suitable devices, but is preferably one that allows some movement of connector 220 with respect to clip 200. For example one such engagement is made by providing an opening 204 in panel 202 that is at somewhat larger than the outer dimensions of connector 220 and providing snap-in type connections 224 between connector 220 and clip 200, so that once connector 220 is snapped into clip 200 it has a small range of movement in two lateral directions, but is prevented from moving out of the plane of clip 200. Alternative ways to achieve this type of connection include, but are not limited to elastomeric connections, or other types of retaining mechanisms that allow some movement of connector 200, such as a retaining bar or lid.

With connector 220 snapped into or otherwise engaging connector clip 200, clip 200 is preferably mounted on the present fan assembly by inserting panel 202 between front plate 24 and rear plate 26 such that one retaining finger 210 engages each of slots 34 and 44. More specifically, tapered back surfaces 214 engage the edges of plates 24 and 26 and cause fingers 210 to flex inward until the edges of lips 212 fit between front plate 24 and rear plate 26. Connector clip 200 is inserted until lips 212 snap into slots 34 and 44 as fingers 210 return to their un-flexed state.

The width of fingers 210 is preferably slightly less than the width of slots 34 and 44. This feature, along with the fact that the length of panel 202 is less than the distance between front plate 24 and rear plate 26 allows connector clip 200 to move in both the x and y directions, but not in the z direction. As drawn, the z direction is parallel to the axes of the pins in the connectors. This arrangement is desirable for the reasons discussed below.

With the fan assembly fully assembled, including grill 50, latch plate 150, grip plate 100, connector 220 and connector clip 200, it is ready to be installed in a computer. The fan assembly is preferably slid into a slot (not shown) in a computer such that the face of housing 20 that is opposite grip plate 100 is at the rear or bottom of the slot. In this position, boss 180 on latch tongue 178 engages a corresponding latching mechanism on one side of the slot and grip plate 100 faces outward. Because connector 220 has a chamfered opening, it will tend to be guided into the correct alignment as the fan assembly is lowered into the slot and connector 220 begins to engage its corresponding connector. This in turn is possible because of the play or movement that is designed into the structure supporting connector 220. The fan assembly is slid into the slot until the connector 220 fully engages a corresponding connector, preferably on a circuit board, and latch tongue 178 snaps into engagement with the slot.

Latch tongue 178 serves to keep the fan assembly from falling out of or being inadvertently removed from the slot. When it is desired to remove the present fan assembly from the slot, removal may be accomplished by inserting one thumb or finger into finger hole 103 and squeezing the free end of tongue 178 toward finger hole 103. Because finger hole 103 is generally aligned with tongue 178 across the width of the assembly, this can comfortably be accomplished using one hand. This disengages tongue 178 from the slot and the fan assembly can be lifted or slid out of the slot. Because connector 220 is prevented from moving in the z direction with respect to the housing, it will be disconnected from the circuit board as the fan assembly is withdrawn from the slot.

The present fan assembly is hot-pluggable, which means that it can be removed from the computer in which it operates with out disrupting operation of that computer. Because the present fan assembly can be connected to the computer both electrically and mechanically without the use of tools, it provides significant advances over the previous state of the art. Both the electrical connection and the mechanical connection can be hot-plugged without any need to adjust alignment or tighten fasteners.

While the fan support apparatus representatively described above provides hot plug connections for the fans, it will readily be appreciated by those skilled in this art that it could also be employed using non-hot plug socket connections for the fans if desired.

What is claimed is:

1. A fan assembly for supporting a fan having blades and for insertion into a mating slot, comprising:
   a housing surrounding and supporting the fan;
   at least one grill positioned so as to restrict access to the fan blades;
   a grip surface on said housing;
   a spring-loaded latch on said housing and configured to engage the mating slot so as to releasably retain the housing in the slot; and
   and an electrical connector mounted in said housing;
   wherein said grip surface is formed on a separate piece from said housing and is affixed to said housing by an integrally formed fastening device; and
   wherein the assembly comprising said housing, grill, grip surface, latch and connector can be assembled by hand without the use of separate fasteners.

2. The fan assembly of claim 1 wherein said grill, said latch, and said grip are assembled sequentially, with each piece engaging the housing and maintaining the previously assembled pieces in engagement with said housing.

3. The fan assembly of claim 1 wherein said electrical connector is held in place on said housing by a connector clip that snaps into said housing.

4. The fan assembly of claim 1 wherein said latch is included on a latch piece that is separate from said housing.

5. The fan assembly of claim 4 wherein said latch piece is affixed to said housing by an integrally formed fastening device.

6. The fan assembly of claim 1 wherein said connector is included on a connector piece that is separate from said housing.

7. The fan assembly of claim 6 wherein said connector piece is affixed to said housing by an integrally formed fastening device.

8. The fan assembly of claim 1 wherein said grill is included on a grill piece that is separate from said housing.

9. The fan assembly of claim 8 wherein said grill piece is affixed to said housing by an integrally formed fastening device.

10. The fan assembly of claim 8 further including a grip piece that includes said grip, wherein said grill piece is maintained in alignment with said housing by said grip piece.

11. The fan assembly of claim 10 further including a latch piece that includes said latch, wherein said grip piece is maintained in engagement with said housing by said latch piece.

12. A fan assembly for supporting a fan and for insertion into a mating slot, comprising:
    a housing surrounding and supporting the fan;
    at least one grill positioned so as to restrict access to the fan, said grill being included on a grill piece that is separate from said housing and affixed to said housing by an integrally formed fastening device;
    a grip surface on said housing, said grip surface being formed on a separate piece from said housing and affixed to said housing by an integrally formed fastening device;
    a spring-loaded latch configured to engage the mating slot so as to releasably retain the housing in the slot, said latch being included on a latch piece that is separate from said housing and affixed to said housing by an integrally formed fastening device: and
    an electrical connector included on a connector piece that is separate from said housing, said connector being affixed to said housing by an integrally formed fastening device;
    wherein the assembly comprising said housing, grill, grip surface, latch and connector can be assembled by hand without the use of separate fasteners.

13. The fan assembly of claim 12 wherein said grip piece is maintained in engagement with said housing by said latch piece.

14. The fan assembly of claim 12 wherein said grill, said latch, and said grip are assembled sequentially, with each piece engaging the housing and maintaining the previously assembled pieces in engagement with said housing.

15. The fan assembly of claim 12 wherein said electrical connector includes at least one pin and said electrical connector being mounted on said housing such that said connector can move in directions normal to said pin but is substantially restrained from moving in directions parallel to said pin.

16. The fan assembly of claim 12 wherein said electrical connector is held in place on said housing by a connector clip that snaps into said housing.

17. A fan assembly for supporting a fan having blades and for insertion into a mating slot, comprising:
   a housing surrounding and supporting the fan;
   at least one grill affixed to said housing and positioned so as to restrict access to the fan blades;
   a spring-loaded latch on said housing and configured to engage the mating slot so as to releasably retain the housing in the slot, said latch including a releasing member; and
   a grip surface on said housing, said grip surface including a finger-engaging space positioned substantially opposite to said releasing member such that an operator can release said releasing member with one hand;
   wherein said grip surface is formed on a separate piece from said housing and is affixed to said housing by an integrally formed fastening device.

18. The fan assembly of claim 17 wherein said wherein the assembly can be assembled by hand without the use of separate fasteners.

19. The fan assembly of claim 17 wherein said grill, said latch, and said grip are each separate pieces and are assembled onto said housing sequentially, with each piece engaging the housing and maintaining the previously assembled pieces in engagement with said housing.

* * * * *